(12) United States Patent
Sato

(10) Patent No.: US 10,608,635 B2
(45) Date of Patent: Mar. 31, 2020

(54) WIRING WITH EXTERNAL TERMINAL

(71) Applicant: MICRON TECHNOLOGY, INC., Boise, ID (US)

(72) Inventor: Toshiyuki Sato, Inagi (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/183,615

(22) Filed: Nov. 7, 2018

(65) Prior Publication Data

US 2019/0074834 A1    Mar. 7, 2019

Related U.S. Application Data

(63) Continuation of application No. 15/669,801, filed on Aug. 4, 2017, now Pat. No. 10,141,932.

(51) Int. Cl.
| | |
|---|---|
| *H01L 25/00* | (2006.01) |
| *H03K 19/00* | (2006.01) |
| *H01L 23/522* | (2006.01) |
| *G11C 5/02* | (2006.01) |
| *G11C 5/14* | (2006.01) |
| *H01L 23/528* | (2006.01) |
| *G11C 5/06* | (2006.01) |

(52) U.S. Cl.
CPC ......... *H03K 19/0013* (2013.01); *G11C 5/025* (2013.01); *G11C 5/14* (2013.01); *H01L 23/5226* (2013.01); *H01L 23/5286* (2013.01); *G11C 5/063* (2013.01); *G11C 2207/105* (2013.01)

(58) Field of Classification Search
CPC .. H03K 19/0013; H01L 23/5226; G11C 5/063

USPC .......................................................... 326/102
See application file for complete search history.

(56) References Cited

U.S. PATENT DOCUMENTS

| | | | | |
|---|---|---|---|---|
| 5,594,371 A | * | 1/1997 | Douseki | H01L 27/12 257/E27.111 |
| 6,278,148 B1 | * | 8/2001 | Watanabe | G11C 5/063 257/208 |
| 6,292,015 B1 | * | 9/2001 | Ooishi | G11C 5/147 326/101 |

(Continued)

FOREIGN PATENT DOCUMENTS

| | | |
|---|---|---|
| JP | 11031385 A | 2/1999 |
| WO | 2018084909 A1 | 5/2018 |

OTHER PUBLICATIONS

U.S. Appl. No. 15/709,250, titled "Power Supply Wiring in a Semiconductor Memory Device", filed Sep. 19, 2017; pp. all.

(Continued)

*Primary Examiner* — Daniel D Chang
(74) *Attorney, Agent, or Firm* — Dorsey & Whitney LLP

(57) ABSTRACT

Apparatuses for providing external terminals of a semiconductor device are described. An example apparatus includes: a pad included in a pad formation area that receives a power voltage; a sub-threshold current reduction circuit (SCRC) included in a peripheral circuit area including a via disposed on a first side of the peripheral circuit area, and a wiring that couples the pad to the via. The SCRC further includes: a voltage line coupled to the via; a logic gate circuit that propagates a signal; an SCRC voltage line coupled to the logic gate circuit; and a SCRC switch disposed in proximity to the via and couples the SCRC voltage line to the voltage line.

20 Claims, 10 Drawing Sheets

(56) References Cited

U.S. PATENT DOCUMENTS

| | | | |
|---|---|---|---|
| 6,310,487 B1 * | 10/2001 | Yokomizo | G01R 31/2884 324/750.3 |
| 8,269,348 B2 | 9/2012 | Fazelpour | |
| 10,020,252 B2 | 7/2018 | Miura et al. | |
| 10,141,932 B1 | 11/2018 | Sato | |
| 10,304,497 B2 | 5/2019 | Nishizaki | |
| 2003/0038653 A1 | 2/2003 | Ooishi et al. | |
| 2004/0047229 A1 | 3/2004 | Fujisawa et al. | |
| 2004/0217776 A1 | 11/2004 | Horiguchi et al. | |
| 2006/0227587 A1 * | 10/2006 | Nakamura | G11C 5/04 365/63 |
| 2006/0267219 A1 | 11/2006 | Nakamura et al. | |
| 2007/0045828 A1 | 3/2007 | Kwon et al. | |
| 2008/0220607 A1 | 9/2008 | Hummler | |
| 2009/0290271 A1 | 11/2009 | Yang et al. | |
| 2010/0214812 A1 | 8/2010 | Kim | |
| 2010/0230780 A1 | 9/2010 | Obayashi | |
| 2010/0301466 A1 | 12/2010 | Taoka et al. | |
| 2011/0254617 A1 | 10/2011 | Ishii et al. | |
| 2013/0285247 A1 | 10/2013 | Minda et al. | |
| 2013/0328589 A1 | 12/2013 | Ishii | |
| 2014/0003113 A1 | 1/2014 | Seno et al. | |
| 2014/0063887 A1 | 3/2014 | Vogelsang | |
| 2015/0035054 A1 | 2/2015 | Nishizaki | |
| 2015/0108637 A1 | 4/2015 | Usami et al. | |
| 2015/0221714 A1 | 8/2015 | Gu et al. | |
| 2015/0302900 A1 | 10/2015 | Lee et al. | |
| 2017/0110160 A1 | 4/2017 | Seo et al. | |
| 2017/0110161 A1 | 4/2017 | Seo | |
| 2018/0130739 A1 | 5/2018 | Miura et al. | |
| 2018/0254245 A1 | 9/2018 | Miura et al. | |
| 2019/0057726 A1 | 2/2019 | Nishizaki | |
| 2019/0295605 A1 | 9/2019 | Nishizaki | |

OTHER PUBLICATIONS

"RDL—Bond Pad Redistribution Layers", obtained at: http://www.yieldengineering.com/portals/0/yes-rdl_explanation.pdf on Nov. 4, 2016, pp. all.

U.S. Appl. No. 15/669,801, titled, "Wiring With External Terminal", filed Aug. 4, 2017; pp. all.

International Search Report and Written Opinion dated Nov. 15, 2018 for PCT Application No. PCT/US2018/044695.

* cited by examiner

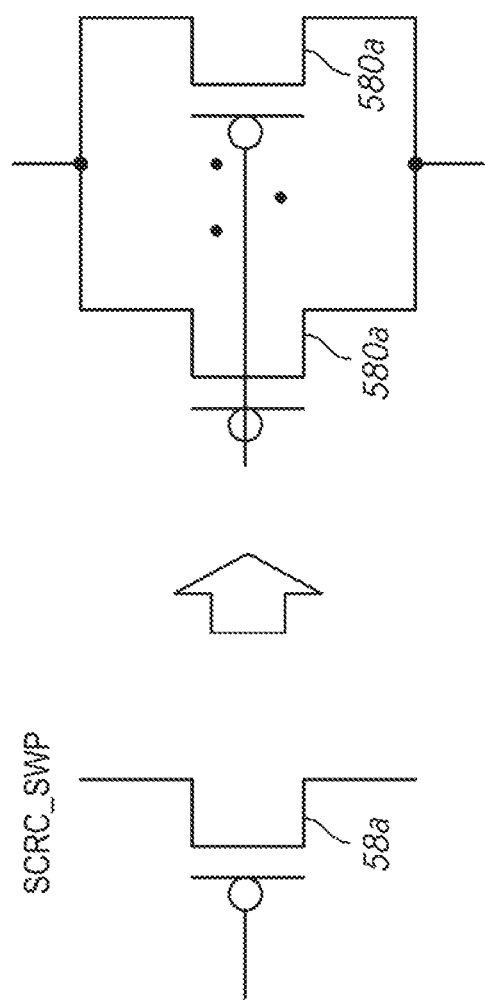
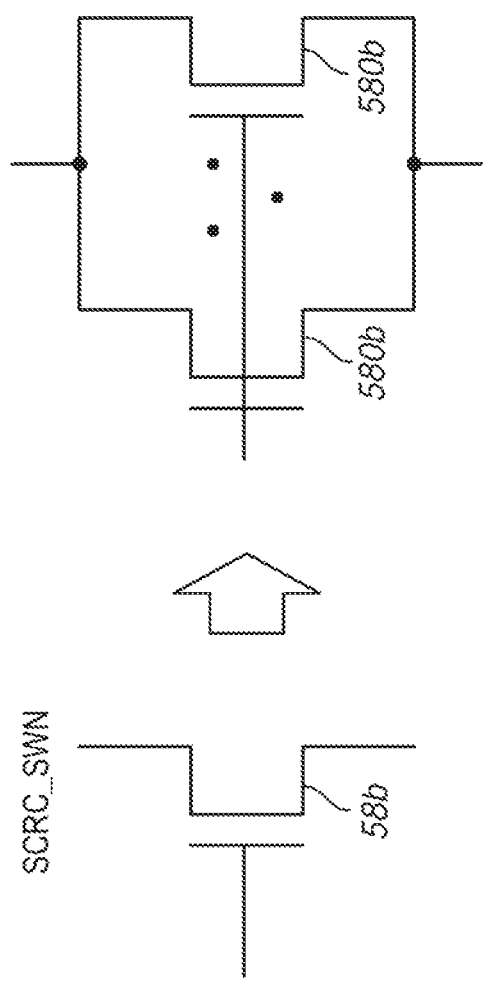
FIG. 9A
FIG. 9B

WIRING WITH EXTERNAL TERMINAL

CROSS-REFERENCE TO RELATED APPLICATION

This application is a continuation of U.S. patent application Ser. No. 15/669,801, filed Aug. 4, 2017, issued as U.S. Pat. No. 10,141,932 on Nov. 27, 2018. This application, and issued patent, are incorporated by reference herein in their entirety and for all purposes.

BACKGROUND

High data reliability, high speed of memory access, reduced chip size and reduced power consumption are features that are demanded from semiconductor memory.

In conventional peripheral circuitries for a semiconductor device, for example, pads and data queue circuits (or data input/output circuits) are arranged in a corresponding manner across layers. The data queue circuit or data input/output circuit is called collectively "DQ circuit" hereinafter. A sub-threshold current reduction circuit (SCRC) has been introduced into conventional semiconductor devices to protect a circuit from an off-state current (Ioff) into a critical path when the chip (die) is in an off state. FIGS. 1A and 1B are circuit diagrams of a sub-threshold current reduction circuit (SCRC) in a conventional semiconductor device. In the SCRC, a high power supply voltage VOL(Hi) and a low power supply voltage VOL(Lo) indicate power supply voltages applied to a semiconductor device from an external, and a high SCRC voltage VOLSCRC(Hi) and a low SCRC voltage VOLSCRC(Lo) indicate internal SCRC power voltages applied through switches of the SCRC (VOLSCRC SW) to logic circuits such as inverters.

FIG. 2A is a layout diagram of a plurality of switches of the SCRCs (VOLSCRC SWs) in a conventional semiconductor device. FIG. 2B is a circuit diagram of the plurality of switches of the SCRCs (VOLSCRC SWs) in the conventional semiconductor device of FIG. 2A. The switches of the SCRCs (VOLSCRC SWs) are located near logic circuits, regardless of operation types of the logic circuits and configured to couple VOL lines having the power supply voltage VOL to VOLSRCS lines having the SCRC voltage VOLSCRC in order to generate the SCRC voltage VOLSCRC. In a conventional semiconductor chip, the power supply voltage VOL may be provided from an uppermost-level conductive layer including a pad (e.g., an inline redistribution layer (iRDL)) to an M3 pad on a metal 3 level layer that may provide the power supply voltage VOL on the VOL lines throughout the chip, and the switches of the SCRCs (VOLSCRC SWs) are located near the logic circuits to provide the SCRC voltage VOLSCRC. Each switch of the SCRC (VOLSCRC SW) has a size approximately three times to five times of a size of each transistor in logic circuits driven by the VOLSCRC SW to prevent a voltage (IR) drop that occurs locally due to the logic circuits that operate irregularly Each switch of the SCRC (VOLSCRC SW) also propagates an IR drop on the VOL lines to the VOLSCRC lines that causes a local area dependency in the chip resulting in time lags and the VOLSCRC SW area needs to be designed large enough to prevent such IR drop propagation.

BRIEF DESCRIPTION OF THE DRAWINGS

FIGS. 9A and 9B are schematic diagrams of switches in a sub-threshold current reduction circuit (SCRC) in accordance with an embodiment of the present disclosure.

DETAILED DESCRIPTION OF PREFERRED EMBODIMENTS

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Figures 1A, 1B:
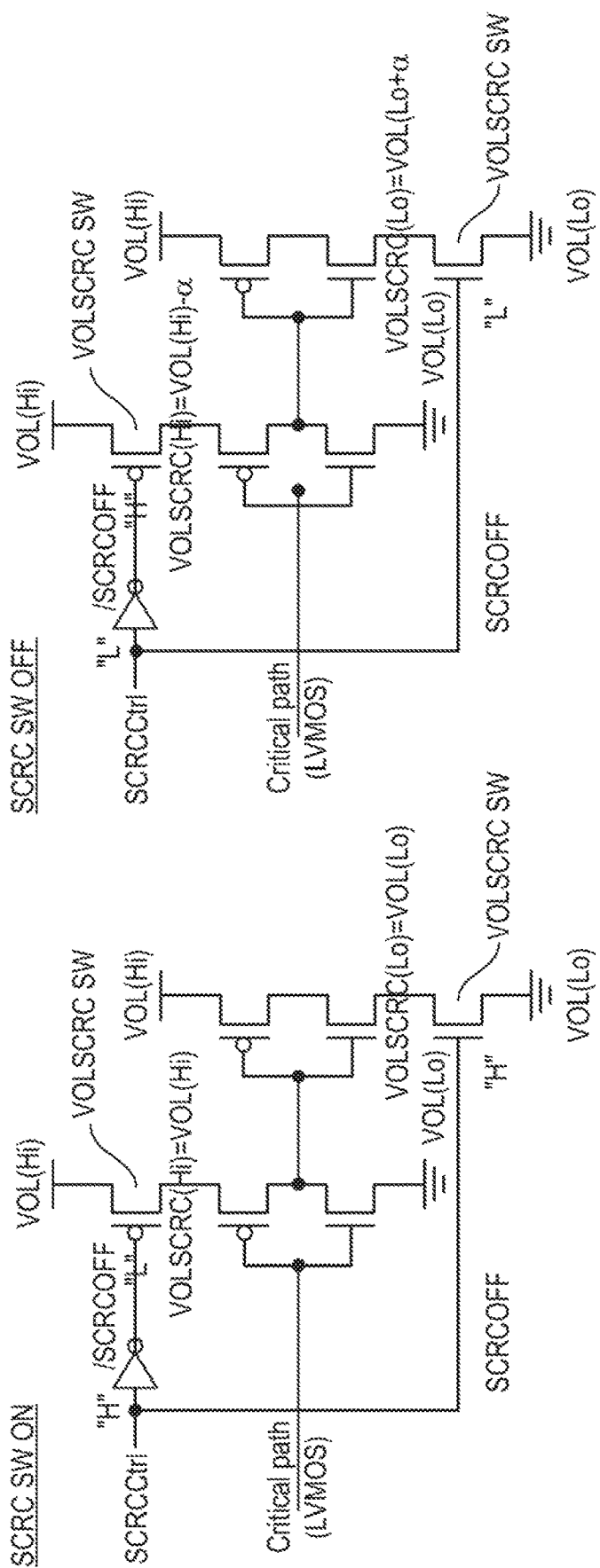
FIGS. 1A and 1B are circuit diagrams of a sub-threshold current reduction circuit (SCRC) in a conventional semiconductor device.
Figures 2A, 2B:
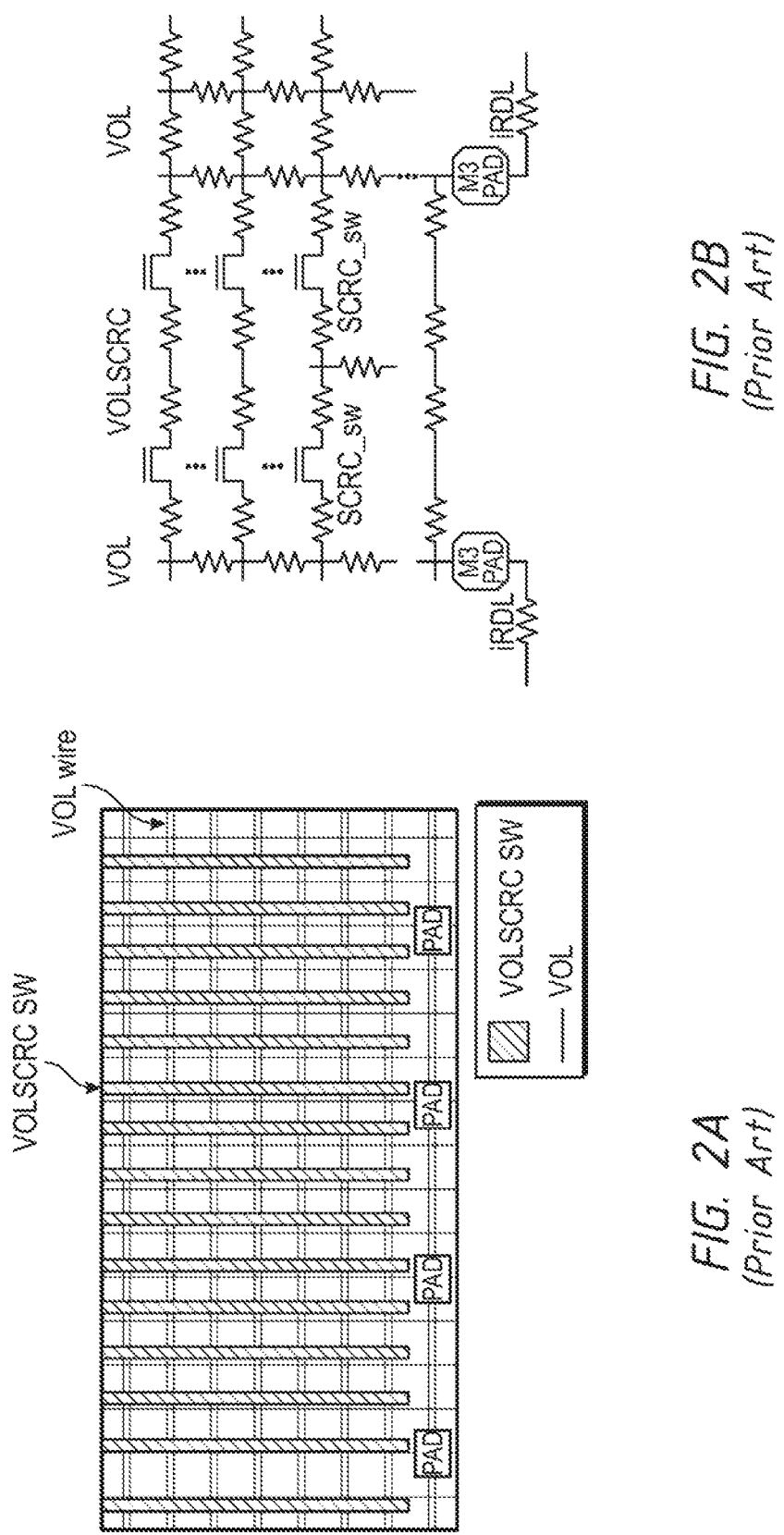
FIG. 2A is a layout diagram of a plurality of switches of the SCRCs (VOLSCRC SWs) in a conventional semiconductor device.
FIG. 2B is a circuit diagram of the plurality of switches of the SCRCs (VOLSCRC SWs) in the conventional semiconductor device of FIG. 2A.
Figure 3:
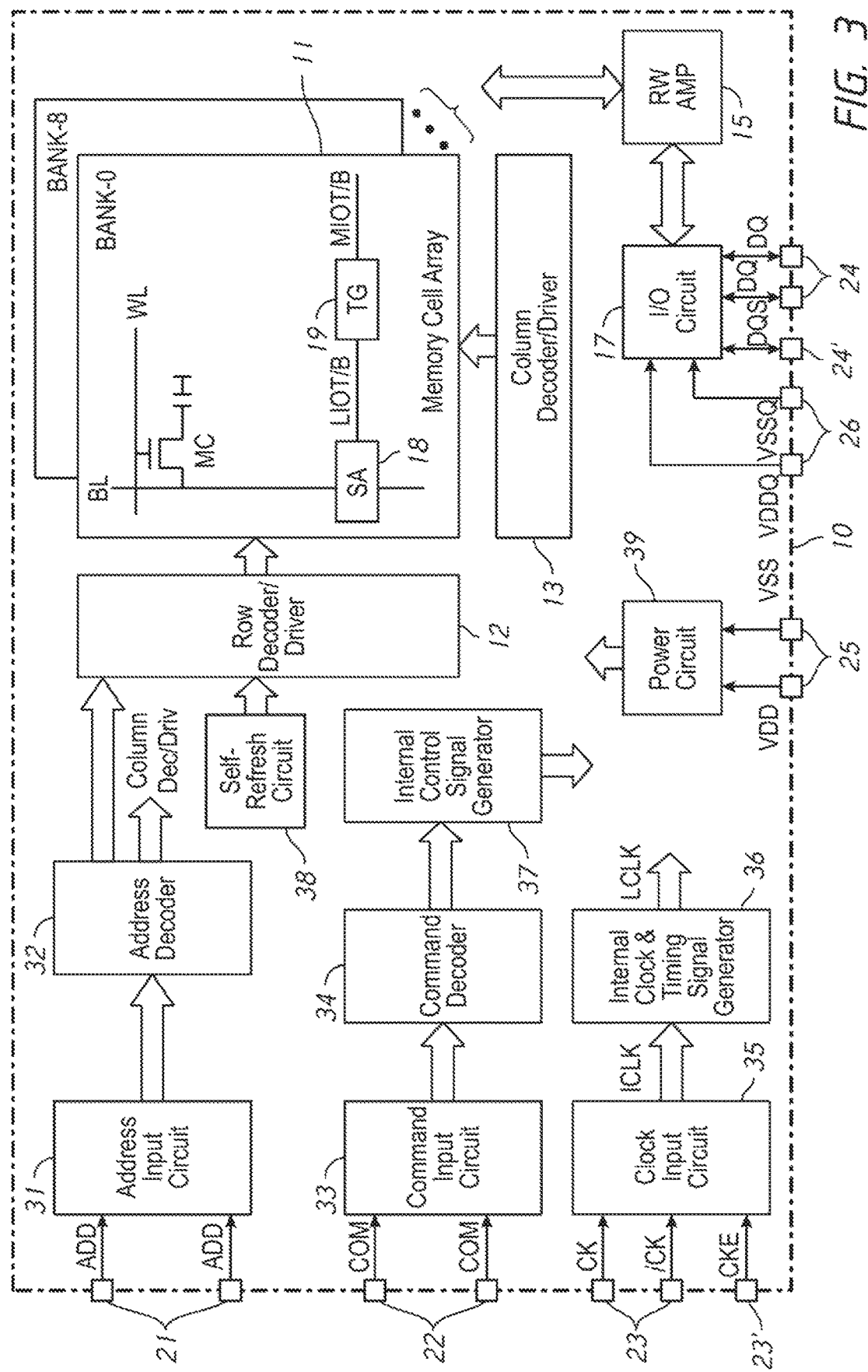
FIG. 3 is a block diagram of a semiconductor device in accordance with the present disclosure.

FIG. 3 is a block diagram of a semiconductor device 10 in accordance with the present disclosure. The semiconductor device 10 may be an SDRAM integrated into a single semiconductor chip (e.g., a semiconductor die), for example. The semiconductor device 10 may be mounted on an external substrate that is a memory module substrate, a mother board or the like. As shown in FIG. 3, the semiconductor device 10 includes a memory cell array 11. The memory cell array 11 includes a plurality of banks, each bank including a plurality of word lines WL, a plurality of bit lines BL, and a plurality of memory cells MC arranged at intersections of the plurality of word lines WL and the plurality of bit lines BL. The selection of the word line WL is performed by a row decoder/driver 12 and the selection of the bit line BL is performed by a column decoder/driver 13. Sense amplifiers 18 are coupled to corresponding bit lines BL and connected to local I/O line pairs LIOT/B. Local IO line pairs LIOT/B are connected to main IO line pairs MIOT/B via transfer gates TG 19 which function as switches.

Turning to the explanation of a plurality of external terminals included in the semiconductor device 10, the plurality of external terminals includes address terminals 21, command terminals 22, clock terminals 23, a clock enable terminal 23', data terminals 24, a data strobe terminal 24', power supply terminals 25 and 26. The data terminals 24 may be coupled to output buffers for read operations of memories. Alternatively, the data terminals 24 may be coupled to input buffers for read/write access of the memories responsive to a data strobe signal provided at the data strobe terminal 24'. FIG. 3 shows an example of dynamic random access memory (DRAM), however, any device having external terminals for signal input/output may be included as the external terminals of embodiments of the present disclosure.

The address terminals 21 are supplied with an address signal ADD and a bank address signal BADD. The address signal ADD and the bank address signal BADD supplied to the address terminals 21 are transferred via an address input circuit 31 to an address decoder 32. The address decoder 32 receives the address signal ADD and supplies a decoded row address signal XADD to the row decoder/driver 12, and a decoded column address signal YADD to the column decoder/driver 13. The address decoder 32 also receives the bank address signal BADD and supplies the bank address signal BADD to the row decoder/driver 12, the column decoder/driver 13. In a self-refresh mode, a self-refresh circuit 38 may provide a row address signal to the row/decoder driver 12 for self-refresh operation.

The command terminals 22 are supplied with a command signal COM. The command signal COM may include one or more separate signals. The command signal COM input to the command terminals 22 is provided to a command decoder 34 via a command input circuit 33. The command decoder 34 decodes the command signal COM and provides the decoded command, and an internal control signal generator 37 may generate various internal command signals responsive to the decoded command from the command decoder 34. For example, the internal commands may include a row command signal to select a word line and a column command signal, such as a read command or a write command, to select a bit line.

Accordingly, when a read command is issued and a row address and a column address are timely supplied with the read command, read data is read from a memory cell MC in the memory cell array 11 designated by these row address and column address. The read data DQ is output externally from the data terminals 24 via a read/write amplifier 15 and an input/output circuit 17. Similarly, when the write command is issued and a row address and a column address are timely supplied with this command, and then write data DQ is supplied to the data terminals 24, the write data DQ is supplied via the input/output circuit 17 and the read/write amplifier 15 to the memory cell array 11 and written in the memory cell MC designated by the row address and the column address.

The clock terminals 23 are supplied with external clock signals CK and /CK, respectively. These external clock signals CK and /CK are complementary to each other and are supplied to a clock input circuit 35 with a clock enable signal. CKE received at the clock enable terminal 23'. The clock input circuit 35 receives the external clock signals CK and /CK and the clock enable signal CKE and generates an internal clock signal ICLK. The internal clock signal ICLK is supplied to an internal clock and timing generator 36 and thus a phase controlled internal clock signal LCLK is generated based on the received internal clock signal ICLK. Although not limited thereto, a DLL circuit can be used as the internal clock and timing generator 36. The phase controlled internal clock signal LCLK is supplied to the input/output circuit 17 and is used as a timing signal for determining an output timing of the read data DQ. The internal clock and timing generator 36 may further generate various internal clock signals.

The power supply terminals 25 are supplied with power supply potentials VDD and VSS. These power supply potentials VDD and VSS are supplied to a power circuit 39. The power circuit 39 generates various internal potentials VPP, VOD, VARY, VPERI, and the like. The internal potential VPP is mainly used in the row decoder/driver 12, the internal potentials VOD and VARY are mainly used in the sense amplifiers 18 included in the memory cell array 11, and the internal potential VPERI is used in many other circuit blocks. The power supply terminals 26 are supplied with power supply potentials VDDQ and VSSQ. These power supply potentials VDDQ and VSSQ are supplied to the input/output circuit 17. The power supply potentials VDDQ and VSSQ may be the same potentials as the power supply potentials VDD and VSS that are supplied to the power supply terminals 25, respectively. However, the power supply potentials VDDQ and VSSQ may be used for the input/output circuit 17 so that power supply noise generated by the input output circuit 17 does not propagate to the other circuit blocks.

Figure 4:
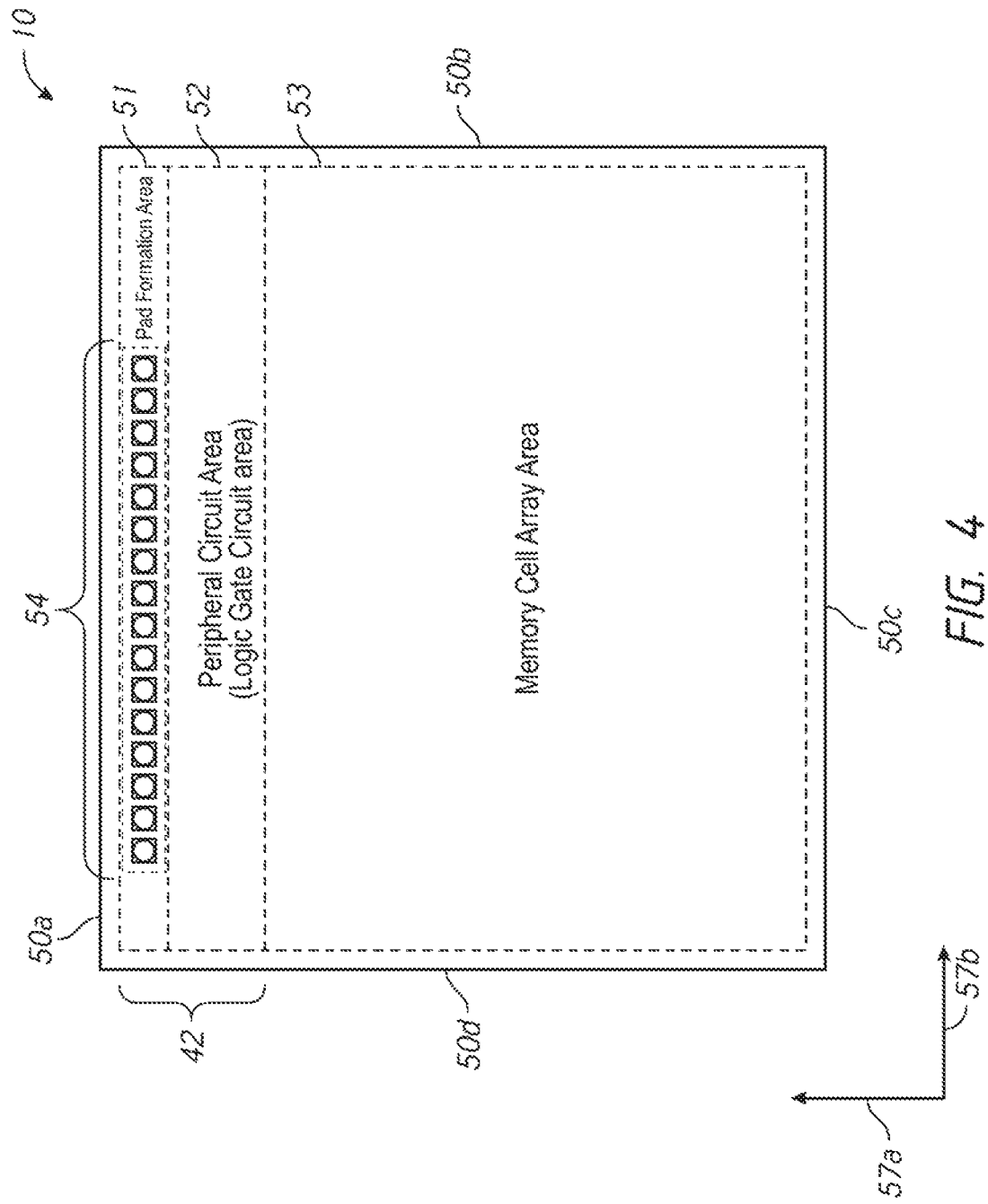
FIG. 4 is a layout diagram of the semiconductor device in accordance with an embodiment of the present disclosure.

FIG. 4 is a layout diagram of the semiconductor device 10 in accordance with one embodiment of the present disclosure. The semiconductor device 10 may have edges 50a, 50b, 50c and 50d, which define ends of the semiconductor device 10. The edges 50b and 50d may be extending along a first direction 57a and the edges 50a and 50c may be extending along a second direction 57b that is substantially perpendicular to the first direction 57a. For example, FIG. 3 may be a plan view of a layout of the semiconductor device 10, including circuits and array areas, from a third direction (not shown) that is perpendicular to the first and second directions, 57a and 57b. The semiconductor device 10 may include a data interface block 42 disposed across a pad formation area 51 and a peripheral circuit area (logic gate circuit area) 52, and a plurality of memory cells disposed in a memory cell array area 53. The pad formation area 51, the peripheral circuit area (logic gate circuit area) 52, and the memory cell array area 53 may be aligned in the first direction 57a in this order, and the peripheral circuit area 52 may be disposed between the pad formation area 51 and the memory cell array area 53. The pad formation area 51 may include a plurality of pads 54 disposed along the edge 50a. For example, the plurality of pads 54 may include external terminals 24 and power supply terminals 26 in FIG. 3. The memory cell array area 53 may include, for example, memory cell array 11 in FIG. 3.

Figure 5:
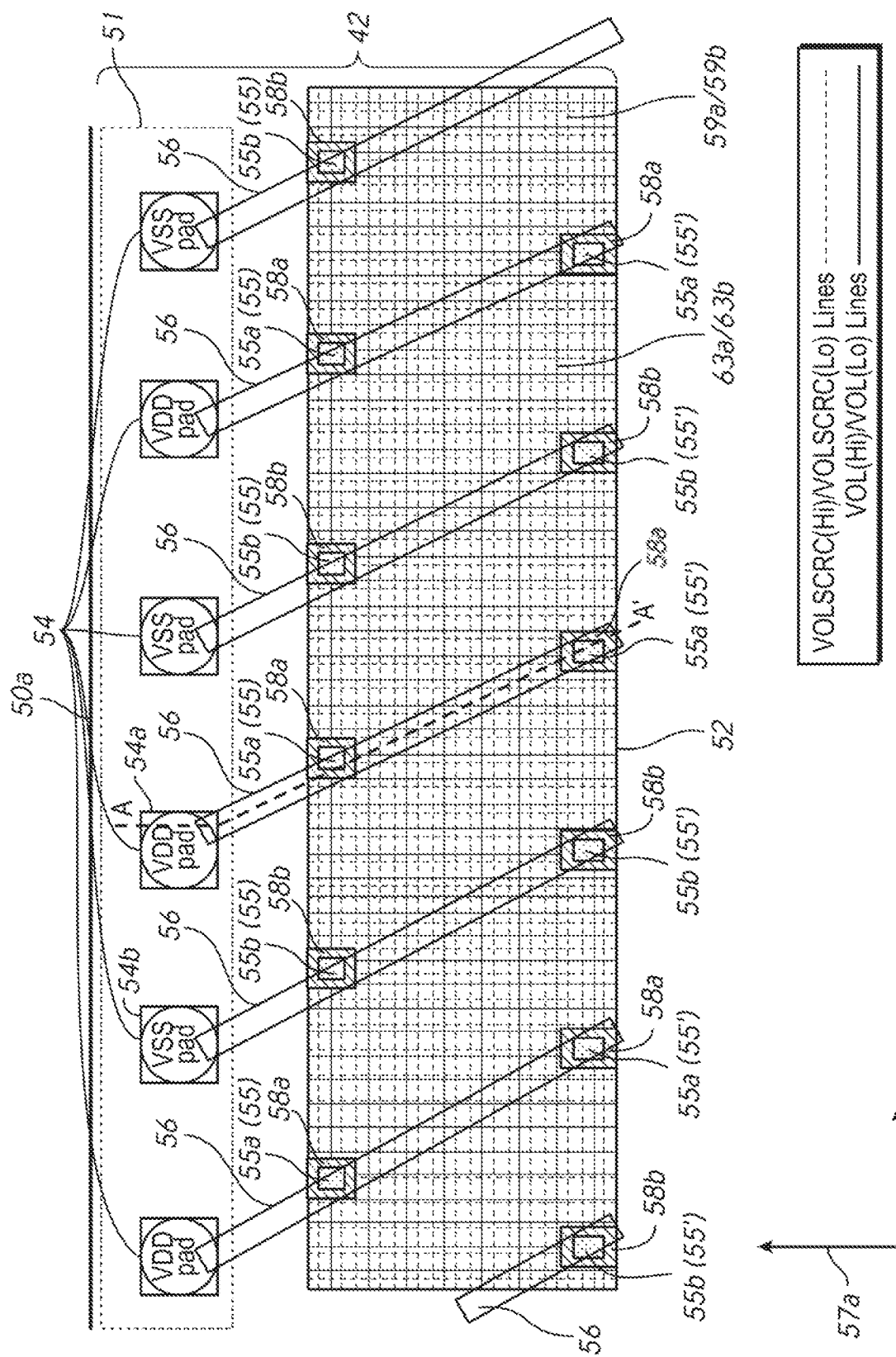
FIG. 5 is a schematic diagram of a data interface block in the semiconductor device in accordance with an embodiment of the present disclosure.

FIG. 5 is a schematic diagram of a data interface block 42 in the semiconductor device 10 in accordance with one embodiment of the present disclosure. For example, FIG. 5 may be a plan view of the data interface block 42 from the third direction (not shown). The data interface block 42 may include the pad formation area 51 and the peripheral circuit area 52 in the first direction 57a. The plurality of pads 54 on the pad formation area 51 may be disposed along the edge 50a that extends in the second direction 57b, which is substantially perpendicular to the first direction 57a. The plurality of pads 54 may include, but not be limited to, a plurality of VDD pads 54a for receiving a first power supply voltage (VDD) and a plurality of VSS pads 54b for receiving a second power supply voltage (VSS, e.g., a ground voltage). The peripheral circuit area 52 may include a plurality of wirings 56. For example, each wiring 56 among the plurality of wirings 56 may be made from a conductive layer (e.g., the iRDL of metal) and may be disposed in a diagonal direction from the first direction 57a and the second direction 57b across the pad formation area 51 and the peripheral circuit area 52 aligned in the first direction 57a. Each wiring 56 of the plurality of wirings 56 may couple a pad of the plurality of pads 54 to a first via among a first plurality of vias 55 disposed along a first side of the peripheral circuit area 52 adjacent to the pad formation area 51 and a second via among a second plurality of vias 55' disposed along a second side of the peripheral circuit area 52 that is opposite to the first side of the peripheral circuit area 52 and is away from the pad 54. The first plurality of vias 55 and the second plurality of vias 55' may include a plurality of first power supply voltage vias (VOL(Hi) via) 55a for providing the first power supply voltage and a plurality of second power supply voltage vias (VOL(Lo) via) 55b for providing the second power supply voltage. The peripheral circuit area 52 may include a plurality of first voltage lines 63a and a plurality of second voltage lines 63b configured to provide the first power supply voltage VOL(Hi) (e.g., VDD) and the second power supply voltage VOL(Lo) (e.g., VSS), respectively. For example, the plurality of first and second voltage lines 63a and 63b may be made of a conductive layer (e.g., metal 3 layer) that is different from the conductive layer of the wirings 56, and may extend in the first direction 57a, or in the second direction 57b, or in the first and second directions 57a and 57b both to form a mesh-structured circuit. The peripheral circuit area 52 may also include a plurality of first SCRC voltage lines 59a and a plurality of second SCRC voltage lines 59b configured to provide a first SCRC voltage (VOLSCRC(Hi)) and a second SCRC voltage (VOLSCRC (Lo)), respectively. For example, the plurality of first and second SCRC voltage lines 59a and 59b may be made of a conductive layer (e.g., metal 3 layer) that is different from the conductive layer of the wirings 56, and may extend in the first direction 57a, or in the second direction 57b, or in the first and second directions 57a and 57b both to form a mesh-structured circuit. The peripheral circuit area 52 may include a plurality of first SCRC switches (SCRC_SWP) 58a or a plurality of second SCRC switches (SCRC_SWN) 58b. For example, each first SCRC switch (SCRC_SWP) 58a of the plurality of first SCRC switches (SCRC_SWP) 58a is disposed in proximity to a corresponding first power supply voltage via (VOL(Hi) via) 55a and may be configured to couple the corresponding first SCRC voltage line 59a to the corresponding first power supply voltage via (VOL(Hi) via) 55a that is coupled to the corresponding first voltage line 63a. Each second SCRC switch (SCRC_SWN) 58b of the plurality of second SCRC switches (SCRC_SWN) 58b is disposed in proximity to a corresponding second power supply voltage via (VOL(Lo) via) 55b and may be configured to couple the plurality of corresponding second SCRC voltage line 59b to the corresponding second power supply voltage via (VOL(Lo) via) 55b that is coupled to the corresponding second voltage line 63b. For example, at least a portion of the plurality of the first SCRC switches (SCRC_SWP) 58a and the plurality of second SCRC switches (SCRC_SWN) 58b may be disposed along a side of the peripheral circuit area 52 that is adjacent to the pad formation area 51 and along another side of the peripheral circuit area 52 that is opposite to the side with respect to the peripheral circuit area 52. A cross sectional view along a line A-A' between a VDD pad 54a and the vias 55a coupled to the VDD pad 54a will be discussed in detail later with reference to FIG. 8.

Figure 6:
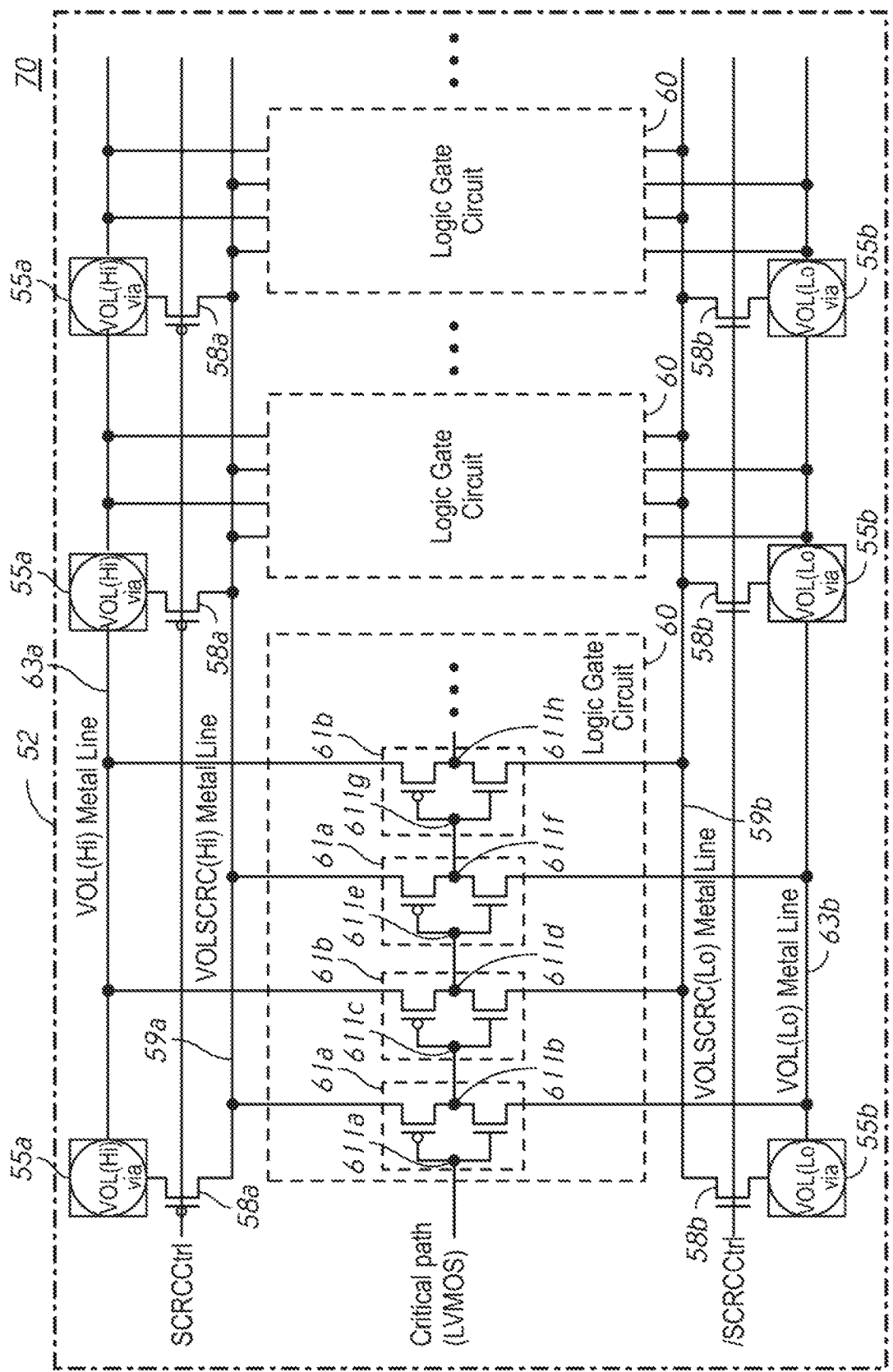
FIG. 6 is a circuit diagram of a portion of an SCRC including a plurality of logic gate circuits in a peripheral circuit area in accordance with an embodiment the present disclosure.

FIG. 6 is a circuit diagram of a portion of an SCRC 70 including a plurality of logic gate circuits 60 in the peripheral circuit area 52 in accordance with an embodiment the present disclosure. FIG. 6 is the circuit diagram of the SCRC 70 described as a transistor level conceptual description. Each logic gate circuit 60 among the plurality of logic gate circuits 60 may include a first plurality of inverters 61a and a second plurality of inverters 61b. For example, the first plurality of inverters 61a may have a first node coupled to the first SCRC voltage line 59a and a second node coupled to a second voltage line 63b. The second plurality of inverters 61b may have a first node coupled to the first voltage line 63a and a second node coupled to a second SCRC voltage line 59b. The first plurality of inverters 61a and the second plurality of inverters 61b are coupled in series in an alternately to provide a path that may be used for a critical path (e.g., a logic path with a longest propagation delay). For example, a first inverter 61a of the first plurality of inverters 61a may have an input node 611a configured to receive an input signal and an output node 611b configured to provide an output signal. A first inverter 61b of the second plurality of inverters 61b may have an input node 611c coupled to the output node 611b of the first inverter 61a of the first plurality of inverters 61a and an output node 611d coupled to an input node 611e of a second inverter 61a of the first plurality of inverters 61a. The second inverter 61a of the first plurality of inverters 61a may have the input node 611e coupled to the output node 611d of the first inverter 61b of the second plurality of inverters 61b and an output node 611f coupled to an input node 611g of a second inverter 61b of the second plurality of inverters 61b. The second inverter 61b of the second plurality of inverters 61b may receive an input signal at the input node 611g and provide an output signal on an output node 611h.

The SCRC 70 may also include first and second voltage lines 63a and 63b, first and second SCRC voltage lines 59a and 59b and the plurality of first SCRC switches 58a and the plurality of second SCRC switches 58b. Each first SCRC switch (SCRC_SWP) 58a of the plurality of first SCRC switches 58a may be a first transistor (e.g., a p-channel field effect transistor (pFET)) that has a first node (e.g., a gate node) that may receive an SCRC control signal (SCRCCtrl), a second node (e.g., a source node) coupled to a first power supply voltage via (VOL(Hi) via) 55a that is coupled to the first voltage line 63a and a third node (e.g., a drain node) coupled to the first SCRC voltage line 59a. The third node of each first SCRC switch (SCRC_SWP) 58a is coupled to the first plurality of inverters 61a. For example, the second node of each first SCRC switch (SCRC_SWP) 58a may be in proximity (e.g., adjacent) to the first power supply voltage via (VOL(Hi) via) 55a. Each second SCRC switch (SCRC_SWN) 58b of the plurality of second SCRC switches 58b may be a second transistor (e.g., an n-channel field effect transistor (nFET)) that has a first node (e.g., a gate node) that may receive an inverted SCRC control signal (/SCRCCtrl), a second node (e.g., a source node) coupled to a first power supply voltage via (VOL(Lo) via) 55b that is coupled to the second voltage line 63b and a third node (e.g., a drain node) coupled to the second SCRC voltage line 59b. The third node of each second SCRC switch (SCRC_SWN) 58b is coupled to the second plurality of inverters 61b. For example, the second node of each second SCRC switch (SCRC_SWN) 58b may be in proximity (e.g., adjacent) to the second power supply voltage via (VOL(Lo) via) 55b.

When the SCRC control signal (SCRCCtrl) is in an inactive state (e.g., a logic low state) and the inverted SCRC control signal (/SCRCCtrl) is in an active state (e.g., a logic high state), the first power supply voltage via (VOL(Hi) via) 55*a* is coupled to the first SCRC voltage line 59*a*, which is coupled to the first plurality of inverters 61*a*, by the first SCRC switch (SCRC_SWP) 58*a* and the second power supply voltage via (VOL(Lo) via) 55*b* is coupled to the second SCRC voltage line 59*b*, which is coupled to the second plurality of inverters 61*b*, by the second SCRC switch (SCRC_SWN) 58*b*. When the SCRC control signal (SCRCCtrl) is in the active state (e.g., the logic high state) and the inverted SCRC control signal (/SCRCCtrl) is in the inactive state (e.g., the logic low state), the first power supply voltage via (VOL(Hi) via) 55*a* is decoupled from the first plurality of inverters 61*a* by the first SCRC switch (SCRC_SWP) 58*a* and the second power supply voltage via (VOL(Lo) via) 55*b* is decoupled from the second plurality of inverters 61*b* by the second SCRC switch (SCRC_SWN) 58*b*.

Figure 7:
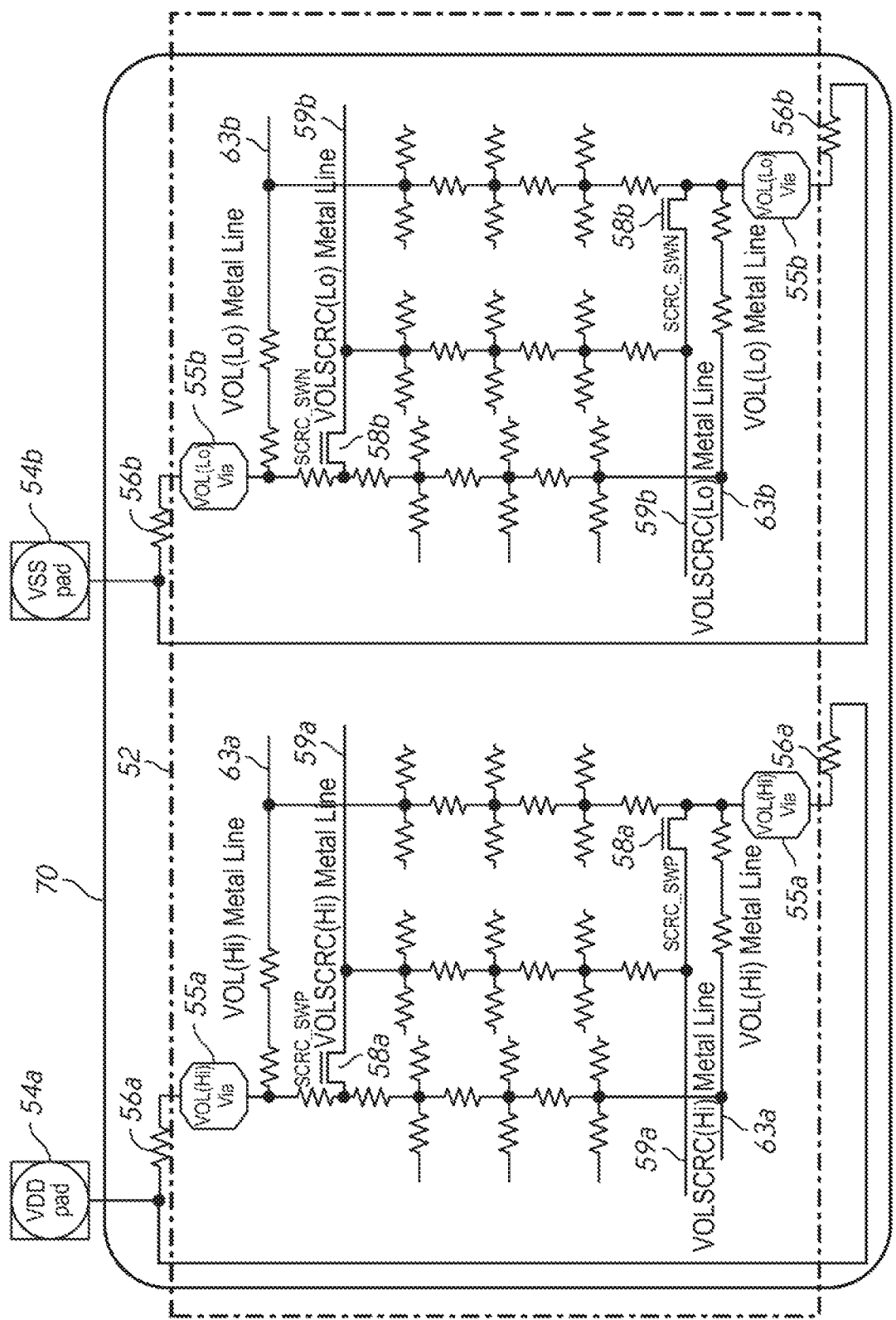
FIG. 7 is a circuit diagram of the SCRC in accordance with an embodiment the present disclosure.

FIG. 7 is a circuit diagram of the SCRC 70 in accordance with an embodiment the present disclosure. FIG. 7 is the circuit diagram of the SCRC described as an impedance level conceptual description. A wiring 56*a* may couple the VDD pad 54*a* to the first power supply voltage via (VOL (Hi) via) 55*a* and a wiring 56*b* may couple the VSS pad 54*b* to the second power supply voltage via (VOL(Lo) via) 55*b*. The wirings 56*a* and 56*b* are made from a first conductive layer (e.g., the iRDL of metal) across the pad formation area 51 and the peripheral circuit area 52. A first SCRC switch (SCRC_SWP) 58*a* is disposed in proximity to the first power supply voltage via (VOL(Hi) via) 55*a* and a second SCRC switch (SCRC_SWN) 58*b* is disposed in proximity to the second power supply voltage via (VOL(Lo) via) 55*b*. The first and second power supply voltage vias (VOL(Hi) via) 55*a* and (SCRC_SWN) 58*b* are made from a second conductive layer (e.g., a metal 3 layer), different from the first conductive layer.

Figure 8:
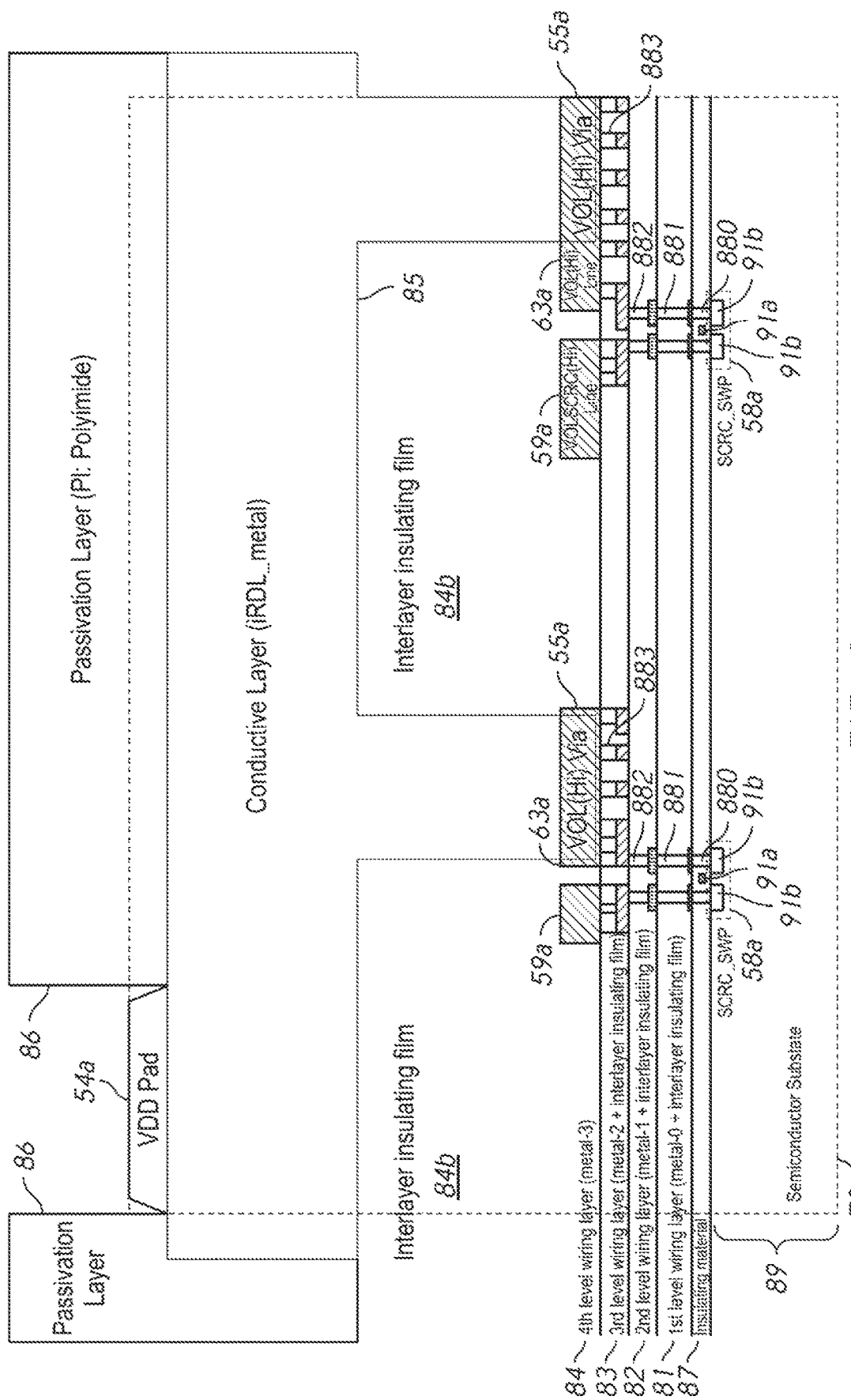
FIG. 8 is a schematic diagram of circuits between a pad and an SCRC in the semiconductor device in accordance with an embodiment the present disclosure.

FIG. 8 is a schematic diagram of an SCRC 70 in the semiconductor device in accordance with an embodiment the present disclosure. For example, FIG. 8 may be a sectional view of the SCRC 70 along a line A-A' in FIG. 5. The SCRC may be disposed across a semiconductor substrate 89, insulating material 87 that insulates the semiconductor substrate 89 and a plurality of wiring layers in a multi-level wiring structure, including first to fourth level wiring layers 81 to 84, a conductor 85 made of a conductive layer covered with a passivation layer 86 surrounding a power supply pad 54 (e.g., a VDD pad 54*a*). In this example, the SCRC 70 including the VDD pad 54*a* is illustrated, however, the SCRC 70 may include the VSS pad 54*b*. Each layer of the first to fourth level wiring layers 81 to 84 may include a metal layer to form a conductive wirings and an interlayer insulating film as an insulator to isolate the metal layer from metal layers of other wiring layers. A circuit component in the metal layer and another component in the metal layer of another wiring layer may be coupled by a contact plug and/or conductive via. The SCRC 70 may be provided through the first to fourth level wiring layers 81 to 84.

Table 1 shows examples of materials and thicknesses of wiring layers.

TABLE 1

| Level of wiring layer | Material | Thickness (um) |
|---|---|---|
| 1$^{st}$ level wiring layer | Metal 0: Tungsten | 0.02 |
| 2$^{nd}$ level wiring layer | Metal 1: Copper | 0.2 |

TABLE 1-continued

| Level of wiring layer | Material | Thickness (um) |
|---|---|---|
| 3$^{rd}$ level wiring layer | Metal 2: Copper | 0.3 |
| 4$^{th}$ level wiring layer | Metal 3: Aluminum | 0.7 |

For example, a gate 91*a* of a transistor of a first SCRC switch (SCRC_SWP) 58*a* in the SCRC 70 may be disposed in the insulating material 87. Source/drain diffusions (a source or drain region) 91*b* of the transistor of the first SCRC switch (SCRC_SWP) 58*a* may be disposed in the semiconductor substrate 89. One of the source/drain diffusions 91*b* may be coupled to a circuit component made of a high conductivity metal layer (Metal 1, of a high conductivity material, such as Copper) in the second level wiring layer 82 via a contact plug 880 in the insulating material 87, a component of a low conductivity metal layer (Metal 0, of a low conductivity material, such as Tungsten) and a conductive plug 881 in the first level wiring layer 81. For example, the low conductive metal layer (Metal 0) disposed in the first level wiring layer 81 is typically very thin, made of high impedance material, such as Tungsten. The circuit component made of the metal layer (Metal 1) in the second level wiring layer 82 may be coupled to a circuit component made of a high conductivity metal layer (Metal 2, of a high conductivity material, such as Copper) in the third level wiring layer 83 by a conductive via 882. A third interlayer insulating film in the third level wiring layer 83 may cover the circuit component made of the metal layer (Metal 2). The circuit component may be coupled to a first power supply voltage via (VOL (Hi) via) 55*a* made of a middle conductivity metal layer (Metal 3, of a middle conductivity material, such as aluminum) in the fourth level wiring layer 84. A fourth interlayer insulating film 84*b* in the fourth level wiring layer 84 may cover the first power supply voltage via (VOL (Hi) via) 55*a*. In this manner, the source or drain region 91*b* of the transistor of the first SCRC switch (SCRC_SWP) 58*a* in the semiconductor substrate 89 may be coupled to the first power supply voltage via (VOL (Hi) via) 55*a* in the fourth level wiring layer 84 through the first to fourth level wiring layers 81 to 84 via contact plugs 880 and 881 and the conductive via 882. Although not shown, a second power supply voltage via (VOL (Lo) via) 55*b* in SCRC 70 of FIG. 6, made of the metal layer (Metal 3) 84*a* in the fourth level wiring layer 84, may be coupled to transistors in the semiconductor substrate 89 via conduct plugs and conductive vias.

The fourth interlayer insulating film 84*b* in the fourth level wiring layer 84 may typically be very thick, covering the metal layer (Metal 3) in the fourth level wiring layer 84. The fourth interlayer insulating film 84*b* may have a hole, and the first power supply voltage via (VOL (Hi) via) 55*a* made of the metal layer (Metal 3) 84*a* may be in contact with the conductor 85 at the hole. The conductor 85 may be made of a distribution conductive layer (e.g., an inline redistribution layer [iRDL]) that is formed on the interlayer insulating film 84*b* at the fourth level wiring layer 84. For example, the distribution conductive layer may be made of a middle conductivity material, such as aluminum with a thickness of approximately 4.5 um. For example, the conductor 85 may have a width of approximately 8 um in order to reduce impedance of the conductor 85. A pad 54, (e.g., the VDD pad 54*a* or the VSS pad 54*b*) may be disposed on the conductor 85, surrounded by the passivation layer 86. For example, the passivation layer 86 may be made of polyimide (PI). Thus, the impedance of the longest conductor 85, such as a wiring 56 between the VDD pad 54a as in FIG. 4 and the first power supply voltage via (VOL (Hi) via) 55a of the SCRC 70 may be reduced.

While a structure of logic circuits (e.g., the logic gate circuits 60 in FIG. 6) inside the peripheral circuit area 52 may change due to circuit design changes, it may be possible to control the impedance between the first power supply voltage via (VOL (Hi) via) 55a and the first SCRC switch (SCRC_SWP) 58a when the first SCRC switch (SCRC_SWP) 58a and the first power supply voltage via (VOL (Hi) via) 55a may be formed to be in proximity to each other. For example, the thickness of the conductor 85 may be a plurality of times, (e.g. at least 5 times) or more than the metal layer (Metal 3) in the fourth level wiring layer 84. Since the conductor 85 may be formed with an increased thickness as discussed above, it may be desirable to form the conductors 85 of the distribution conductive layer using a manufacturing machine that is dedicated to the iRDL forming process independently from a machine for a process forming the plurality of wiring layers including first to fourth level wiring layers 81 to 84 including the plurality of SCRC switches 58. Thus, the impedance of wirings 56 (e.g., the plurality of wirings 56 in FIG. 5) made of the conductors 85 may be controlled and the impedance the first power supply voltage via (VOL (Hi) via) 55a and the first SCRC switch (SCRC_SWP) 58a and the impedance the second power supply voltage via (VOL (Lo) via) 55b and the second SCRC switch (SCRC_SWN) 58b may be controlled within a substantially low level.

FIGS. 9A and 9B are schematic diagrams of switches in a sub-threshold current reduction circuit (SCRC) in accordance with an embodiment of the present disclosure. For example, the first SCRC switch (SCRC_SWP) 58a represented as the first transistor (e.g., a p-channel field effect transistor (pFET)) in FIGS. 6 and 7 may be a plurality of third transistors 580a (e.g., p-channel field effect transistors (pFET)) coupled in parallel as shown in FIG. 9A. Each third transistor 580a in the plurality of third transistors 580a has a first node (e.g., a gate node) commonly coupled to a node that may receive the SCRC control signal (SCRCCtrl), a second node (e.g., a source node) commonly coupled to the first power supply voltage via (VOL(Hi) via) 55a and a third node commonly coupled to the first plurality of inverters 61a. For example, third transistors 580a may be disposed in proximity (e.g., adjacent) to the first power supply voltage via (VOL(Hi) via) 55a. For example, the second SCRC switch (SCRC_SWN) 58b represented as the second transistor (e.g., a n-channel field effect transistor (nFET)) in FIGS. 6 and 7 may be a plurality of fourth transistors 580b (e.g., n-channel field effect transistors (nFET)) coupled as shown in FIG. 9B. Each fourth transistor 580b in the plurality of fourth transistors 580b has a first node (e.g., a gate node) commonly coupled to a node that may receive the inverted SCRC control signal (/SCRCCtrl), a second node (e.g., a source node) commonly coupled to the first power supply voltage via (VOL(Lo) via) 55b that is coupled to the second voltage line 63b, and a third node (e.g., a drain node) commonly coupled to the second SCRC voltage line 59b. For example, the third node of each fourth transistor 580b is coupled to the second plurality of inverters 61b. For example, fourth transistors 580b may be disposed in proximity (e.g., adjacent) to the second power supply voltage via (VOL(Lo) via) 55b.

Figure 10:
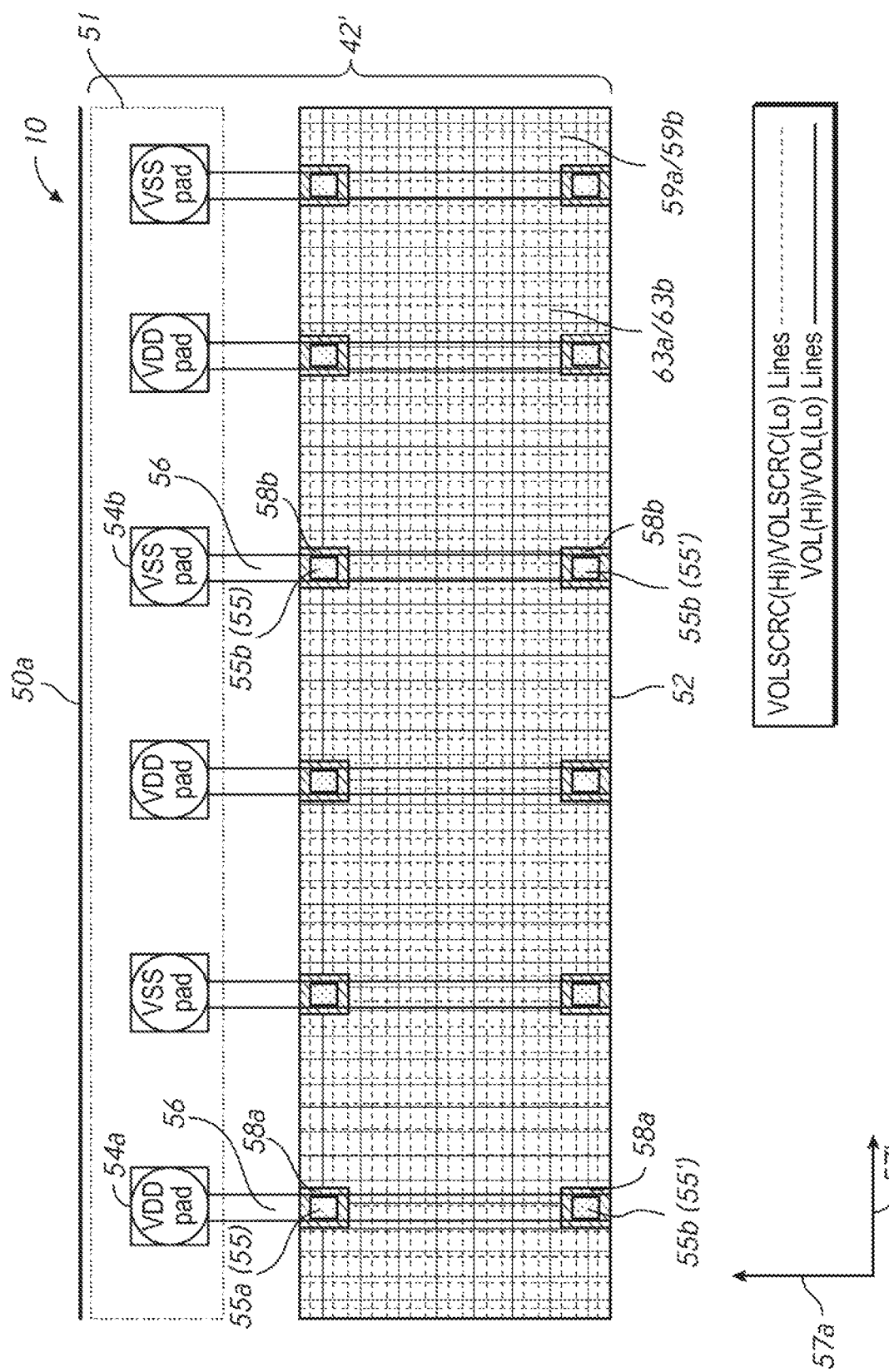
FIG. 10 is a schematic diagram of a data interface block in the semiconductor device in accordance with an embodiment of the present disclosure.

FIG. 10 is a schematic diagram of a data interface block 42' in the semiconductor device 10 in accordance with one embodiment of the present disclosure. For example, FIG. 10 may be a plan view of the data interface block 42' from the third direction (not shown). The data interface block 42' may include components similar to the data interface block 42 of FIG. 5, and elements previously described are referenced using common reference numbers. As such, a detailed description of functionality of components in the data interface block 42' will not be repeated for FIG. 10 in the interest of brevity. The data interface block 42' may include the pad formation area 51 and the peripheral circuit area 52 in the first direction 57a. The peripheral circuit area 52 may include a plurality of wirings 56. For example, each wiring 56 among the plurality of wirings 56 may be made from a conductive layer (e.g., the iRDL of metal) and may be disposed in the first direction 57a across the pad formation area 51 and the peripheral circuit area 52 aligned in the first direction 57a. Each wiring 56 of the plurality of wirings 56 may couple a pad of the plurality of pads 54 (e.g., a VDD pad 54a or a VSS pad 54b) to a first via among a first plurality of vias 55 aligned in the second direction 57b along a first side of the peripheral circuit area 52 adjacent to the pad formation area 51 extended in the second direction 57b, and a second via among a second plurality of vias 55' aligned in the second direction 57b along a second side of the peripheral circuit area 52 extended in the second direction 57b, which is opposite to the first side of the peripheral circuit area 52 with respect to the peripheral circuit area 52 and is away from the pad 54.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:

1. An apparatus comprising:
a first area of a semiconductor including at least one pad;
a second area of the semiconductor including:
at least one via disposed on a first side of the second area;
at least another via disposed on a second side of the second area opposite to the first side, wherein the first side is between the first area and the second side; and
at least one switch disposed in proximity to the at least one via and at least another switch disposed in proximity to the at least another via;
and
at least one wiring configured to couple the at least one pad to the at least one via and the at least another via to provide a first voltage to the at least one switch and the at least another switch.

2. The apparatus of claim 1, further comprising:
a plurality of additional vias including first plurality of vias disposed on the first side of the second area and second plurality of vias disposed on the second side of the second area;

a plurality of additional pads disposed in the first area; and
a plurality of additional wirings configured to couple the plurality of pads to the plurality of vias.

3. The apparatus of claim 2, wherein each of the plurality of additional pads is configured to receive the first voltage or a second voltage, and
wherein the second voltage is different from the first voltage.

4. The apparatus of claim 1, further comprising:
a plurality of additional vias,
wherein each of the plurality of additional vias is disposed on the first side of the second area along with the at least one via, or is disposed on the second side of the second area along with the at least the another via.

5. The apparatus of claim 1, wherein the first and second areas comprise a pad formation area and a peripheral circuit area, respectively.

6. The apparatus of claim 1, wherein a thickness of the at least one wiring is greater than a thickness of a voltage line coupled to the at least one via.

7. The apparatus of claim 1, wherein the at least one wiring comprises a distribution conductor.

8. The apparatus of claim 7, wherein a thickness of the distribution conductor is greater than a thickness of a voltage line coupled to the at least one via.

9. The apparatus of claim 7, wherein a thickness of the distribution conductor is at least five times as thick as a thickness of the voltage line.

10. The apparatus of claim 1 further comprising:
at least another pad in the first area;
a third via disposed on the first side of the second area and a third switch in the proximity to the third via;
a fourth via disposed on the second side of the second area and a fourth switch in the proximity to the fourth via; and
at least another wiring configured to couple the at least another pad to the third and fourth vias to provide a second voltage different from the first voltage to the third and fourth switches.

11. An apparatus comprising:
at least one pad disposed in a first area of a semiconductor;
at least one switch and at least one metal via disposed at a first side of a second area of the semiconductor;
at least another switch and at least another metal via disposed at a second side of the second area opposite from the first side, wherein the first side is between the first area and the second side; and
at least one metal wiring configured to couple the at least one pad to the at least one metal via and the at least another metal via to provide a first voltage to the at least one switch and the at least another switch.

12. The apparatus of claim 11, wherein the at least one metal wiring is a distribution conductor having a thickness at least five times as thick as a thickness of a voltage line coupled to the at least one metal via.

13. The apparatus of claim 11, further comprising:
a plurality of additional pads including first plurality of pads and second plurality of pads,
wherein each of the plurality of additional pads is configured to receive the first voltage or a second voltage, and
wherein the second voltage is different from the first voltage.

14. The apparatus of claim 11, further comprising:
a plurality of additional vias including the at least one metal via;
wherein the first and second areas are a pad formation area and a peripheral circuit area, respectively, and
wherein each of the plurality of additional vias is disposed on the first side of the second area along with the at least one metal via, or is disposed on the second side of the second area along with the at least another metal via.

15. The apparatus of claim 11, wherein the at least one metal wiring has a thickness greater than a thickness of a voltage line coupled to the at least one metal via.

16. The apparatus of claim 11, wherein the at least one switch is disposed in proximity to the at least one metal via.

17. An apparatus comprising:
a first area of a semiconductor including a pad;
a second area of the semiconductor including a sub-threshold current reduction circuit (SCRC), the SCRC including:
a first via disposed on a first side of the second area;
a first switch disposed in proximity to the first via;
a first voltage line coupled to the first via;
a second voltage line configured to be coupled, via the first switch, to the first via;
a second via disposed on a second side of the second area opposite to the first side;
a second switch disposed in proximity to the second via;
a logic gate circuit coupled to the first voltage line; and
a wiring configured to couple the pad to the first via and the second via to provide a first voltage to the first switch and the second switch.

18. The apparatus of claim 17, wherein the SCRC further includes:
a third via disposed on the first side of the second area;
a third switch disposed in proximity to the third via;
a third voltage line coupled to the third via;
a fourth voltage line coupled, via the third switch, to the third via;
a fourth via disposed on the second side of the second area;
a fourth switch disposed in proximity to the fourth via; and
another logic gate circuit coupled to the third voltage line.

19. The apparatus of claim 18, wherein the logic gate circuit is further coupled to the fourth voltage line, and
wherein the another logic gate circuit is further coupled to the second voltage line.

20. The apparatus of claim 18 further comprising:
another pad in the first area of the semiconductor; and
another wiring configured to couple the another pad to the third via and the fourth via to provide a second voltage different from the first voltage to the third switch and the fourth switch.

* * * * *